(12) United States Patent
Wang et al.

(10) Patent No.: US 10,854,626 B2
(45) Date of Patent: Dec. 1, 2020

(54) METHODS FOR FORMING THREE-DIMENSIONAL MEMORY DEVICE HAVING CHANNEL STRUCTURES WITH NATIVE OXIDE LAYER

(71) Applicant: YANGTZE MEMORY TECHNOLOGIES CO., LTD., Wuhan (CN)

(72) Inventors: Qiguang Wang, Wuhan (CN); Lei Jin, Wuhan (CN); Hongtao Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/194,310

(22) Filed: Nov. 17, 2018

(65) Prior Publication Data

US 2020/0111806 A1 Apr. 9, 2020

Related U.S. Application Data

(63) Continuation of application No. PCT/CN2018/109294, filed on Oct. 8, 2018.

(51) Int. Cl.
*H01L 21/336* (2006.01)
*H01L 27/11578* (2017.01)
(Continued)

(52) U.S. Cl.
CPC .... *H01L 27/11578* (2013.01); *G11C 16/0483* (2013.01); *H01L 27/0688* (2013.01);
(Continued)

(58) Field of Classification Search
CPC .................................................. H01L 21/2255
(Continued)

(56) References Cited

U.S. PATENT DOCUMENTS 5,913,149 A * 6/1999 Thakur ............. H01L 21/02046
438/762
2007/0093013 A1* 4/2007 Chua ................... H01L 21/0214
438/197
(Continued)

FOREIGN PATENT DOCUMENTS

| CN | 103258860 A | 8/2013 |
| CN | 107305896 A | 10/2017 |

(Continued)

OTHER PUBLICATIONS

International Search Report issued in corresponding International Application No. PCT/CN2018/109294, dated Jul. 5, 2019, 4 pages.
(Continued)

*Primary Examiner* — Min Huang
(74) *Attorney, Agent, or Firm* — Bayes PLLC

(57) ABSTRACT

Embodiments of 3D memory device having channel structures with a native oxide layer and methods for forming the same are disclosed. In an example, a method for forming a 3D memory device is disclosed. A dielectric stack is formed on a substrate. The dielectric stack includes interleaved first dielectric layers and second dielectric layers on a substrate. An opening extending vertically through the dielectric stack is formed. A native oxide layer is formed along a sidewall of the opening. The native oxide layer includes native oxide of at least some of the first dielectric layers. A deposited oxide layer, a storage layer, a tunneling layer, and a semiconductor channel are subsequently formed in this order over the native oxide layer and along the sidewall of the opening. A memory stack includes interleaved conductor layers and the second dielectric layers is formed by replacing, with the conductor layers, the first dielectric layers in the dielectric stack.

20 Claims, 11 Drawing Sheets

(51) Int. Cl.
*G11C 16/04* (2006.01)
*H01L 27/06* (2006.01)
*H01L 27/10* (2006.01)
*H01L 27/11551* (2017.01)
*H01L 27/11565* (2017.01)

(52) U.S. Cl.
CPC ...... *H01L 27/101* (2013.01); *H01L 27/11551* (2013.01); *H01L 27/11565* (2013.01)

(58) Field of Classification Search
USPC .................................................. 257/E21.268
See application file for complete search history.

(56) References Cited

U.S. PATENT DOCUMENTS

| | | | | |
|---|---|---|---|---|
| 2010/0133603 A1* | 6/2010 | Sekiguchi | ......... | H01L 27/11524 257/319 |
| 2011/0217828 A1 | 9/2011 | Son et al. | | |
| 2012/0295409 A1 | 11/2012 | Yun et al. | | |
| 2013/0320294 A1* | 12/2013 | Cappellani | ........ | H01L 29/66439 257/9 |
| 2014/0252565 A1* | 9/2014 | Greer | ................ | H01L 21/31122 257/635 |
| 2014/0284695 A1* | 9/2014 | Won | .................. | H01L 29/42344 257/324 |
| 2015/0171106 A1 | 6/2015 | Suh | | |
| 2016/0005953 A1* | 1/2016 | Lee | ......................... | H01L 43/08 711/126 |
| 2017/0148808 A1* | 5/2017 | Nishikawa | ............ | H01L 23/528 |

FOREIGN PATENT DOCUMENTS

| | | |
|---|---|---|
| CN | 107527920 A | 12/2017 |
| CN | 107591409 A | 1/2018 |
| CN | 108122924 A | 6/2018 |
| CN | 108140644 A | 6/2018 |
| CN | 108538846 A | 9/2018 |
| CN | 109496359 A | 3/2019 |
| EP | 3316304 A2 | 5/2018 |

OTHER PUBLICATIONS

Written Opinion of the International Searching Authority issued in corresponding International Application No. PCT/CN2018/109294, dated Jul. 5, 2019, 5 pages.

\* cited by examiner

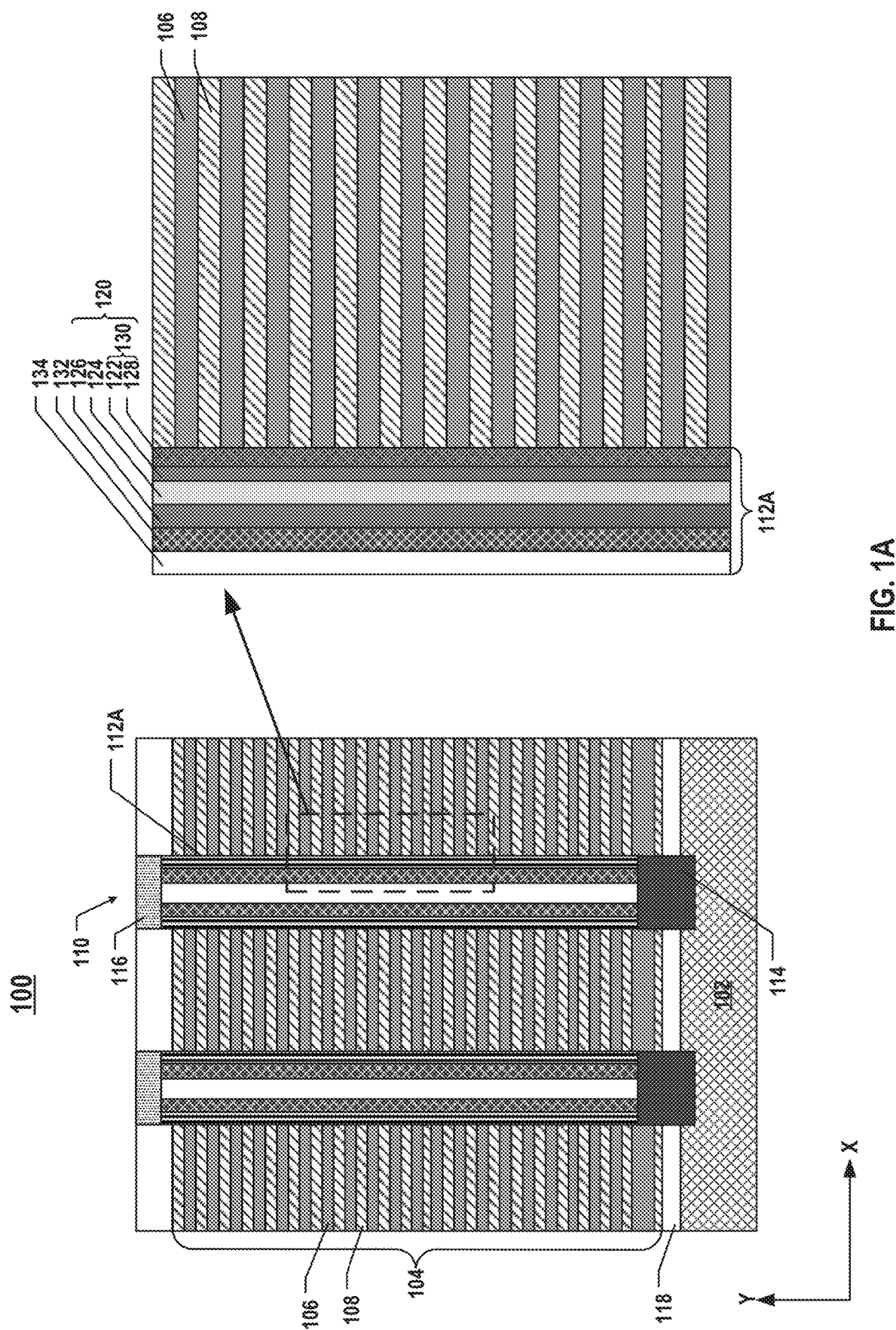

METHODS FOR FORMING THREE-DIMENSIONAL MEMORY DEVICE HAVING CHANNEL STRUCTURES WITH NATIVE OXIDE LAYER

CROSS REFERENCE TO RELATED APPLICATION

This application is continuation of International Application No. PCT/CN2018/109294, filed on Oct. 8, 2018, entitled "METHODS FOR FORMING THREE-DIMENSIONAL MEMORY DEVICE HAVING CHANNEL STRUCTURES WITH NATIVE OXIDE LAYER," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory device having channel structures with a native oxide layer and methods for forming the same are disclosed herein.

In one example, a method for forming a 3D memory device is disclosed. A dielectric stack is formed on a substrate. The dielectric stack includes interleaved first dielectric layers and second dielectric layers on a substrate. An opening extending vertically through the dielectric stack is formed. A native oxide layer is formed along a sidewall of the opening. The native oxide layer includes native oxide of at least some of the first dielectric layers. A deposited oxide layer, a storage layer, a tunneling layer, and a semiconductor channel are subsequently formed in this order over the native oxide layer and along sidewall of the opening. A memory stack includes interleaved conductor layers and the second dielectric layers is formed by replacing, with the conductor layers, the first dielectric layers in the dielectric stack.

In another example, a method for forming a 3D memory device is disclosed. A dielectric stack including interleaved first dielectric layers and second dielectric layers is formed on a substrate. An opening extending vertically through the dielectric stack is formed. A native oxide layer is formed along a sidewall of the opening. The native oxide layer includes native oxide of at least some of the first dielectric layers. A storage layer, a tunneling layer, and a semiconductor channel are subsequently formed in this order over the native oxide layer and along sidewall of the opening. A memory stack including interleaved conductor layers and the second dielectric layers is formed by replacing, with the conductor layers, the first dielectric layers in the dielectric stack.

In still another example, a 3D memory device includes a substrate, a memory stack disposed on the substrate and including interleaved conductor layers and dielectric layers, and a channel structure extending vertically through the memory stack. The channel structure includes a native oxide layer abutting the interleaved conductor layers and dielectric oxide layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 1A illustrates a cross-section of an exemplary 3D memory device having a channel structure with a native oxide layer, according to some embodiments of the present disclosure.

Figure 1B:
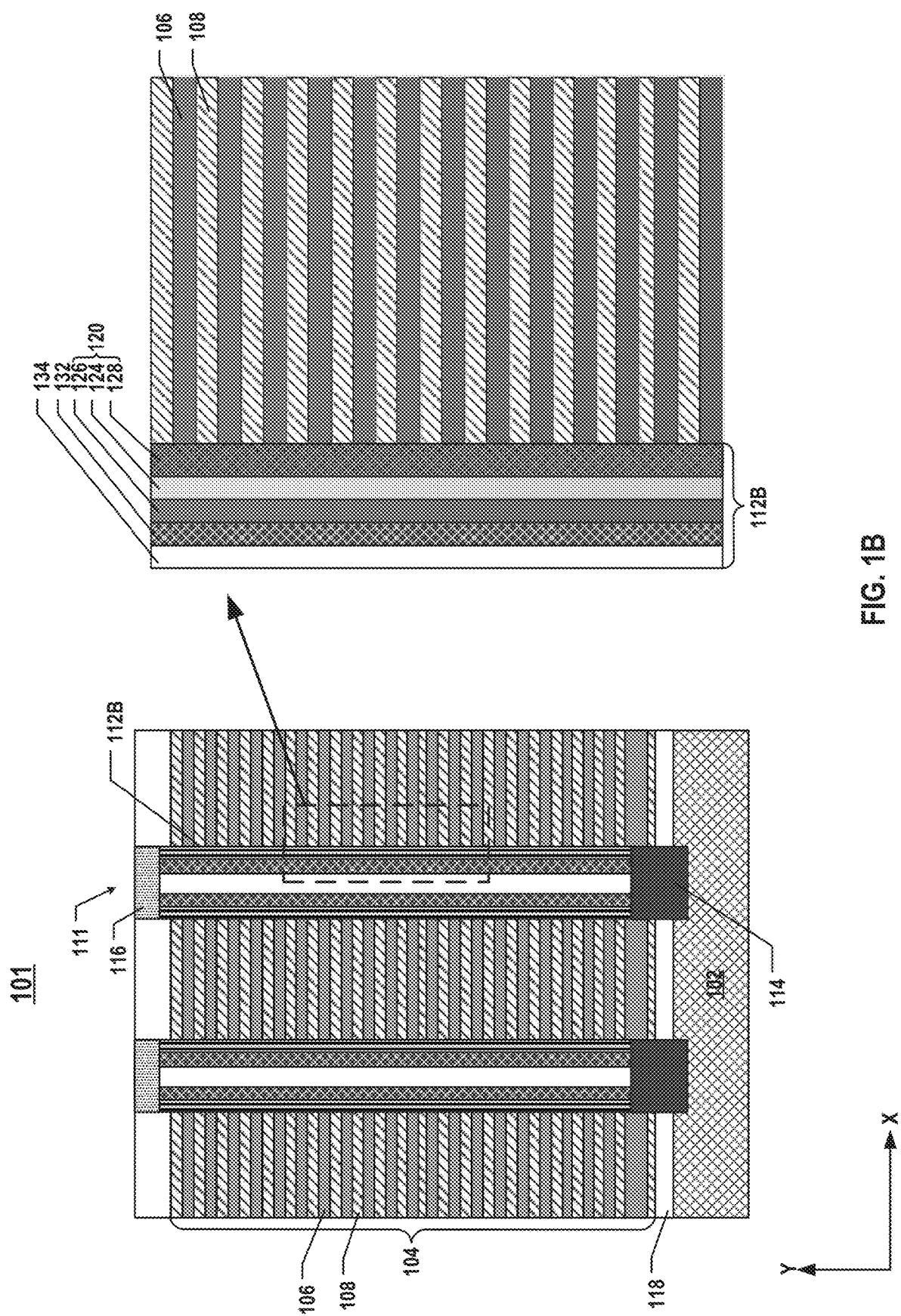
FIG. 1B illustrates a cross-section of another exemplary 3D memory device having a channel structure with a native oxide layer, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a memory film typically is a composite dielectric layer including a silicon oxide tunneling layer, a silicon nitride charge trapping layer, and a silicon oxide blocking layer. The blocking layer can prevent electron injection from the gate, adjust channel electrical field, and suppress charge loss, thereby improving program speed, ease depth, and device reliability. Blocking layers are usually made from silicon oxide or high-dielectric constant (high-k) dielectrics, such as aluminum oxide ($Al_2O_3$).

In existing 3D NAND memory devices, after etching through the dielectric stack (e.g., including interleaved silicon oxide layers and silicon nitride layers) to form channel holes, blocking layers are deposited along the sidewall of each channel hole using conformal thin film deposition processes, such as chemical vapor deposition (CVD) or atomic layer deposition (ALD). However, during the later gate replacement processes, in particular when removing the silicon nitride layers in the dielectric stack using wet etching, the etchants inevitably etch part of the blocking layers, causing damages to the blocking layers and impairing the performance of the 3D NAND memory devices.

Various embodiments in accordance with the present disclosure provide an effective structure and method for protecting blocking layers in the memory films of 3D memory devices from damages during the later gate replacement processes using a native oxide layer. In some embodiments, parts of silicon nitride layers abutting the sidewall of channel holes are oxidized to form native oxide prior to the deposition of memory films. The native oxide layer can serve as a protective layer, such that the blocking layers can remain intact as long as the native oxide layer has not been fully etched by the etchants during the later gate replacement processes. The thickness of the native oxide layer can be controlled to various extents, such that the native oxide layer can be part of a blocking layer or serve as the blocking layer by itself according to various embodiments of the present disclosure.

FIG. 1A illustrates a cross-section of an exemplary 3D memory device 100 having a channel structure 112A with a native oxide layer 128, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. It is noted that x and y axes are included in FIG. 1A to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on,"

"above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing spatial relationship is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device.

In some embodiments, 3D memory device 100 is a NAND Flash memory device in which memory cells are provided in the form of an array of NAND memory strings 110 each extending vertically above substrate 102. The memory array device can include NAND memory string 110 that extends through a plurality of pairs each including a dielectric layer 106 and a conductor layer (referred to herein as "conductor/dielectric layer pairs"). The stacked conductor/dielectric layer pairs are also referred to herein as a "memory stack" 104. The number of the conductor/dielectric layer pairs in memory stack 104 (e.g., 32, 64, 96, or 128) can set the number of memory cells in 3D memory device 100. Conductor layers 108 and dielectric layers 106 in memory stack 104 can alternate in the vertical direction. In other words, except the ones at the top and the bottom of memory stack 104, each conductor layer 108 can be adjoined by two dielectric layers 106 on both sides, and each dielectric layer 106 can be adjoined by two conductor layers 108 on both sides. Conductor layers 108 can each have the same thickness or have different thicknesses. Similarly, dielectric layers 106 can each have the same thickness or have different thicknesses. Conductor layers 108 can include conductive materials including, but not limited to, tungsten (W), cobalt (Co), copper (Cu), aluminum (Al), polysilicon, doped silicon, silicides, or any combination thereof. Dielectric layers 106 can include dielectric materials including, but not limited to, silicon oxide, silicon nitride, silicon oxynitride, or any combination thereof. In some embodiments, an insulation layer 118 is formed between substrate 102 and memory stack 104 and includes dielectric materials, such as silicon oxide.

As shown in FIG. 1A, NAND memory string 110 can include a channel structure 112A extending vertically through memory stack 104. Channel structure 112A can include a channel hole filled with semiconductor material(s) (e.g., as a semiconductor channel 132, shown in the enlarged view on the right) and dielectric material(s) (e.g., as a memory film 120, shown in the enlarged view on the right). In some embodiments, semiconductor channel 132 includes silicon, such as amorphous silicon, polysilicon, or single crystalline silicon. In some embodiments, memory film 120 is a composite layer including a tunneling layer 126, a storage layer 124 (also known as a "charge trap layer"), and a blocking layer 130. The remaining space of channel structure 112A can be partially or fully filled with a capping layer 134 including dielectric materials, such as silicon oxide. Channel structure 112A can have a cylinder shape (e.g., a pillar shape). Capping layer 134, semiconductor channel 132, tunneling layer 126, storage layer 124, and blocking layer 130 are arranged radially from the center toward the outer surface of the pillar in this order, according to some embodiments. Tunneling layer 126 can include silicon oxide, silicon oxynitride, or any combination thereof. Storage layer 124 can include silicon nitride, silicon oxynitride, silicon, or any combination thereof.

As shown in FIG. 1A, blocking layer 130 of channel structure 112A can be a composite layer including (i) a native oxide layer 128 abutting interleaved conductor layers 108 and dielectric layers 106 of memory stack 104, and (ii) a deposited oxide layer 122 in contact with native oxide layer 128 (between native oxide layer 128 and storage layer 124). In some embodiments, native oxide layer 128 includes native oxide of parts of the dielectric layers (e.g., silicon nitride layers) replaced by conductor layers 108 and parts of dielectric layers 106 (e.g., silicon oxide layers) abutting the sidewall of channel structure 112A. That is, native oxide layer 128 in channel structure 112A is not in contact with storage layer 124 as it forms blocking layer 130 in conjunction with deposited oxide layer 122.

As described below in detail, native oxide layer 128 can be formed in any suitable manners, such as by thermal oxidation or wet chemical oxidation (e.g., using chemicals containing ozone). Compared with deposited oxide layer 122, which can be formed by depositing oxides (e.g., silicon oxide) on to the surface of a structure using thin film deposition processes, native oxide layer 128 it is the own oxide of the structure. It is understood that when native oxide layer 128 and deposited oxide layer 122 include the same oxide materials, such as silicon oxide, depending on the specific processes for forming native oxide layer 128 and deposited oxide layer 122, it may be difficult to discern the interface between native oxide layer 128 and deposited oxide layer 122. In some embodiments in which native oxide layer 128 is formed by thermal oxidation, native oxide layer 128 has a higher quality (e.g., higher density and/or higher dielectric strengths), with a cleaner interface (e.g., less dangling bonds at the interface), than deposited oxide layer 122.

In some embodiments in which dielectric layers 106 include silicon oxide and the dielectric layers replaced by conductor layers 108 include silicon nitride, native oxide layer 128 includes silicon oxide, which from both parts of dielectric layers 106 and the native oxide of the silicon nitride layers. It is understood that depending on the oxidization processes (e.g., the extent to which nitrogen atoms and ions are removed from the native oxide), the native oxide can be entirely silicon oxide, entirely silicon oxynitride, and a mixture of silicon oxide and silicon oxynitride. As a result, in some embodiments, native oxide layer 128 includes both silicon oxide and silicon oxynitride. Deposited oxide layer 122 can include the same oxide materials as native oxide layer 128 or different oxide materials. For example, deposited oxide layer 122 can include silicon oxide, silicon oxynitride, high-k dielectrics, or any combination thereof.

In some embodiments, the thickness of native oxide layer 128 is between about 0.5 nm and about 5 nm, such as between 0.5 nm and 5 nm (e.g., 0.5 nm, 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values). In some embodiments, the thickness of native oxide layer 128 is between about 0.5 nm and about 3 nm, such as between 0.5 nm and 3 nm. In some embodiments, the thickness of native oxide layer 128 is about 1 nm, such as 1 nm. In some embodiments, the combined thickness of native oxide layer 128 and thickness of deposited oxide layer 122 (i.e., the thickness of blocking layer 130) is between about 4 nm and about 8 nm, such as between 4 nm and 8 nm. Accordingly, the thickness of deposited oxide layer can be equal to or less than about 7.5 nm.

In some embodiments, conductor layer 108 (each being part of a word line) in memory stack 104 functions as a gate conductor of memory cells in NAND memory string 110. Conductor layer 108 can include multiple control gates of multiple NAND memory cells and can extend laterally as a word line ending at the edge of memory stack 104 (e.g., in a staircase structure of memory stack 104). In some embodiments, memory cell transistors in NAND memory string 110 include gate conductors (i.e., parts of conductor layers 108 that abut channel structure 112A) made from tungsten, adhesion layers (not shown) including titanium/titanium nitride (Ti/TiN) or tantalum/tantalum nitride (Ta/TaN), gate dielectric layers (not shown) made from high-k dielectric materials, and channel structure 112A including polysilicon.

In some embodiments, NAND memory string 110 further includes a semiconductor plug 114 in the lower portion (e.g., at the lower end) of NAND memory string 110. As used herein, the "upper end" of a component (e.g., NAND memory string 110) is the end farther away from substrate 102 in the y-direction, and the "lower end" of the component (e.g., NAND memory string 110) is the end closer to substrate 102 in the y-direction when substrate 102 is positioned in the lowest plane of 3D memory device 100. Semiconductor plug 114 can include a semiconductor material, such as silicon, which is epitaxially grown from substrate 102 in any suitable directions. It is understood that in some embodiments, semiconductor plug 114 includes single crystalline silicon, the same material of substrate 102. In other words, semiconductor plug 114 can include an epitaxially-grown semiconductor layer that is the same as the material of substrate 102. In some embodiments, part of semiconductor plug 114 is above the top surface of substrate 102 and in contact with semiconductor channel 132. Semiconductor plug 114 can function as a channel controlled by a source select gate of NAND memory string 110.

In some embodiments, NAND memory string 110 further includes a channel plug 116 in the upper portion (e.g., at the upper end) of NAND memory string 110. Channel plug 116 can be in contact with the upper end of semiconductor channel 132. Channel plug 116 can include semiconductor materials (e.g., polysilicon) or conductive materials (e.g., metals). In some embodiments, channel plug 116 includes an opening filled with Ti/TiN or Ta/TaN as an adhesion layer and tungsten as a conductor. By covering the upper end of channel structure 112A during the fabrication of 3D memory device 100, channel plug 116 can function as an etch stop layer to prevent etching of dielectrics filled in channel structure 112A, such as silicon oxide and silicon nitride. In some embodiments, channel plug 116 also functions as the drain of NAND memory string 110.

FIG. 1B illustrates a cross-section of another exemplary 3D memory device 101 having a channel structure 112B with native oxide layer 128, according to some embodiments of the present disclosure. Similar to 3D memory device 100 described above in FIG. 1A, 3D memory device 101 represents an example of a 3D memory device having channel structures with a native oxide layer. Different from 3D memory device 100 described above in FIG. 1A in which native oxide layer 128 and deposited oxide layer 122 together form blocking layer 130, channel structure 112B in 3D memory device 101 in FIG. 1B does not include a deposited oxide layer as part of blocking layer 130, such that native oxide layer 128 itself becomes the blocking layer of 3D memory device 101. It is understood that the details of similar structures (e.g., materials, fabrication process, functions, etc.) in both 3D memory devices 100 and 101 may not be repeated below.

As shown in FIG. 1B, a NAND memory string 111 can include a channel structure 112B extending vertically through memory stack 104. Channel structure 112B can include a channel hole filled with semiconductor material(s) (e.g., as semiconductor channel 132, shown in the enlarged view on the right) and dielectric material(s) (e.g., as memory film 120, shown in the enlarged view on the right). In some embodiments, semiconductor channel 132 includes silicon, such as amorphous silicon, polysilicon, or single crystalline silicon. In some embodiments, memory film 120 is a composite layer including tunneling layer 126, storage layer 124 (also known as a "charge trap layer"), and blocking layer (native oxide layer) 128. The remaining space of channel structure 112B can be partially or fully filled with capping layer 134 including dielectric materials, such as silicon oxide. Channel structure 112B can have a cylinder shape (e.g., a pillar shape). Capping layer 134, semiconductor channel 132, tunneling layer 126, storage layer 124, and blocking layer 128 are arranged radially from the center toward the outer surface of the pillar in this order, according to some embodiments. Tunneling layer 126 can include silicon oxide, silicon oxynitride, or any combination thereof. Storage layer 124 can include silicon nitride, silicon oxynitride, silicon, or any combination thereof.

As shown in FIG. 1B, blocking layer 128 of channel structure 112B can be a native oxide layer 128 abutting interleaved conductor layers 108 and dielectric layers 106 of memory stack 104 and in contact with storage layer 124 (between memory stack 104 and storage layer 124). In some embodiments in which storage layer 124 includes a silicon nitride layer or a silicon oxynitride layer, native oxide layer 128 is in contact with the silicon nitride layer or silicon oxynitride layer. In some embodiments, native oxide layer 128 includes native oxide of parts of the dielectric layers (e.g., silicon nitride layers) replaced by conductor layers 108 and parts of dielectric layers 106 (e.g., silicon oxide layers) abutting the sidewall of channel structure 112B. In some embodiments in which dielectric layers 106 include silicon oxide and the dielectric layers replaced by conductor layers 108 include silicon nitride, native oxide layer 128 includes silicon oxide, which from both parts of dielectric layers 106 and the native oxide of the silicon nitride layers. It is understood that depending on the oxidization processes (e.g., the extent to which nitrogen atoms and ions are removed from the native oxide), the native oxide can be entirely silicon oxide, entirely silicon oxynitride, and a mixture of silicon oxide and silicon oxynitride. As a result, in some embodiments, native oxide layer 128 includes both silicon oxide and silicon oxynitride.

In some embodiments, the thickness of native oxide layer 128 (i.e., the thickness of the blocking layer) is between about 4 nm and about 8 nm, such as between 4 nm and 8 nm (e.g., 4 nm, 4.5 nm, 5 nm, 5.5 nm, 6 nm, 6.5 nm, 7 nm, 7.5 nm, 8 nm, any range bounded by the lower end by any of these values, or in any range defined by any two of these values). In some embodiments, since the blocking layer in channel structure 112B includes only native oxide layer 128, the thickness of native oxide layer 128 in channel structure 112B is greater than the thickness of native oxide layer 128 in channel structure 112A. For example, the thickness of native oxide layer 128 is between about 5 nm and about 8 nm, such as between 5 nm and 8 nm. In some embodiments, the thickness of native oxide layer 128 is about 6 nm, such as 6 nm.

Figure 3:
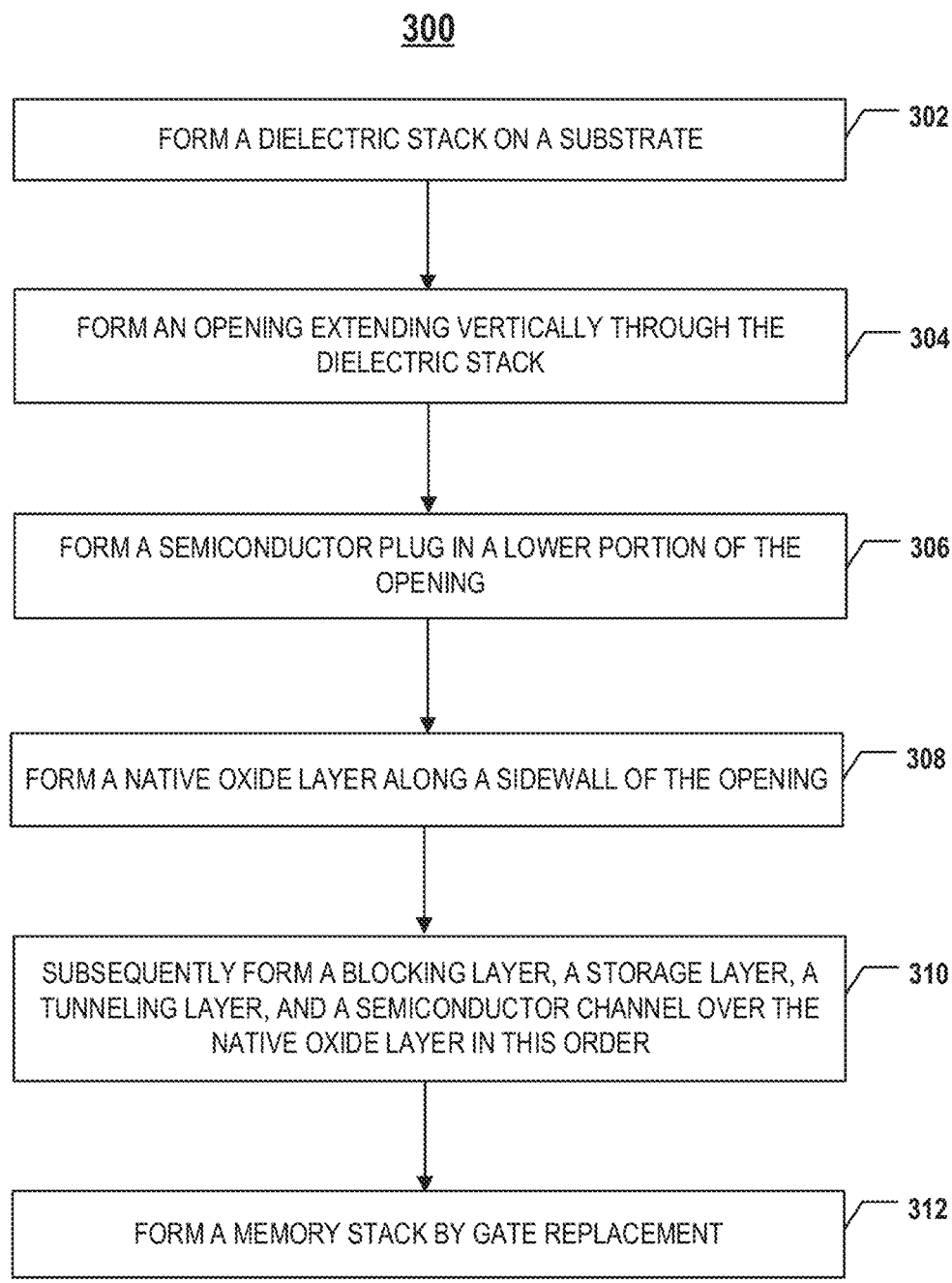
FIG. 3 illustrates a flowchart of an exemplary method for forming a 3D memory device having a channel structure with a native oxide layer, according to some embodiments of the present disclosure.
Figure 4:
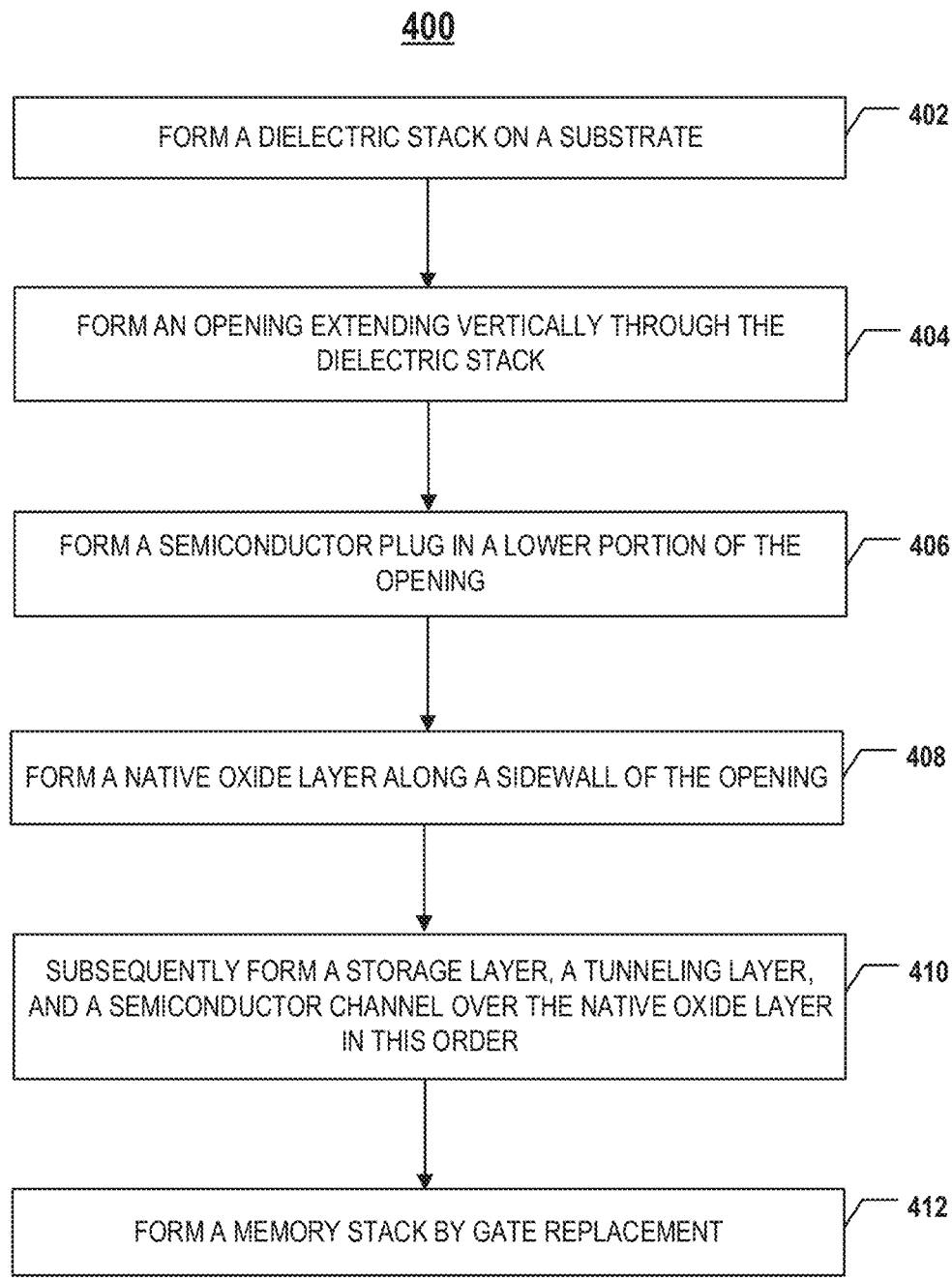
FIG. 4 illustrates a flowchart of another exemplary method for forming a 3D memory device having a channel structure with a native oxide layer, according to some embodiments of the present disclosure.

FIGS. 2A-2G illustrate an exemplary fabrication process for forming a 3D memory device having a channel structure with a native oxide layer, according to some embodiments of the present disclosure. FIG. 3 illustrates a flowchart of an exemplary method 300 for forming a 3D memory device having a channel structure with a native oxide layer, according to some embodiments of the present disclosure. FIG. 4 illustrates a flowchart of another exemplary method 400 for forming a 3D memory device having a channel structure with a native oxide layer, according to some embodiments of the present disclosure. Examples of the 3D memory device depicted in FIGS. 2A-2G and 3-4 include 3D memory devices 100 and 101 depicted in FIGS. 1A-1B. FIGS. 2A-2G and 3-4 will be described together. It is understood that the operations shown in methods 300 and 400 are not exhaustive and that other operations can be performed as well before, after, or between any of the illustrated operations. Further, some of the operations may be performed simultaneously, or in a different order than shown in FIGS. 3-4.

Referring to FIG. 3, method 300 starts at operation 302, in which a dielectric stack is formed on a substrate. Similarly, referring to FIG. 4, method 400 starts at operation 402, in which a dielectric stack is formed on a substrate. The substrate can be a silicon substrate. The dielectric stack can include interleaved first dielectric layers and second dielectric layers. In some embodiments, each of the first dielectric layers includes silicon nitride, and each of the second dielectric layers includes silicon oxide.

Figure 2A:
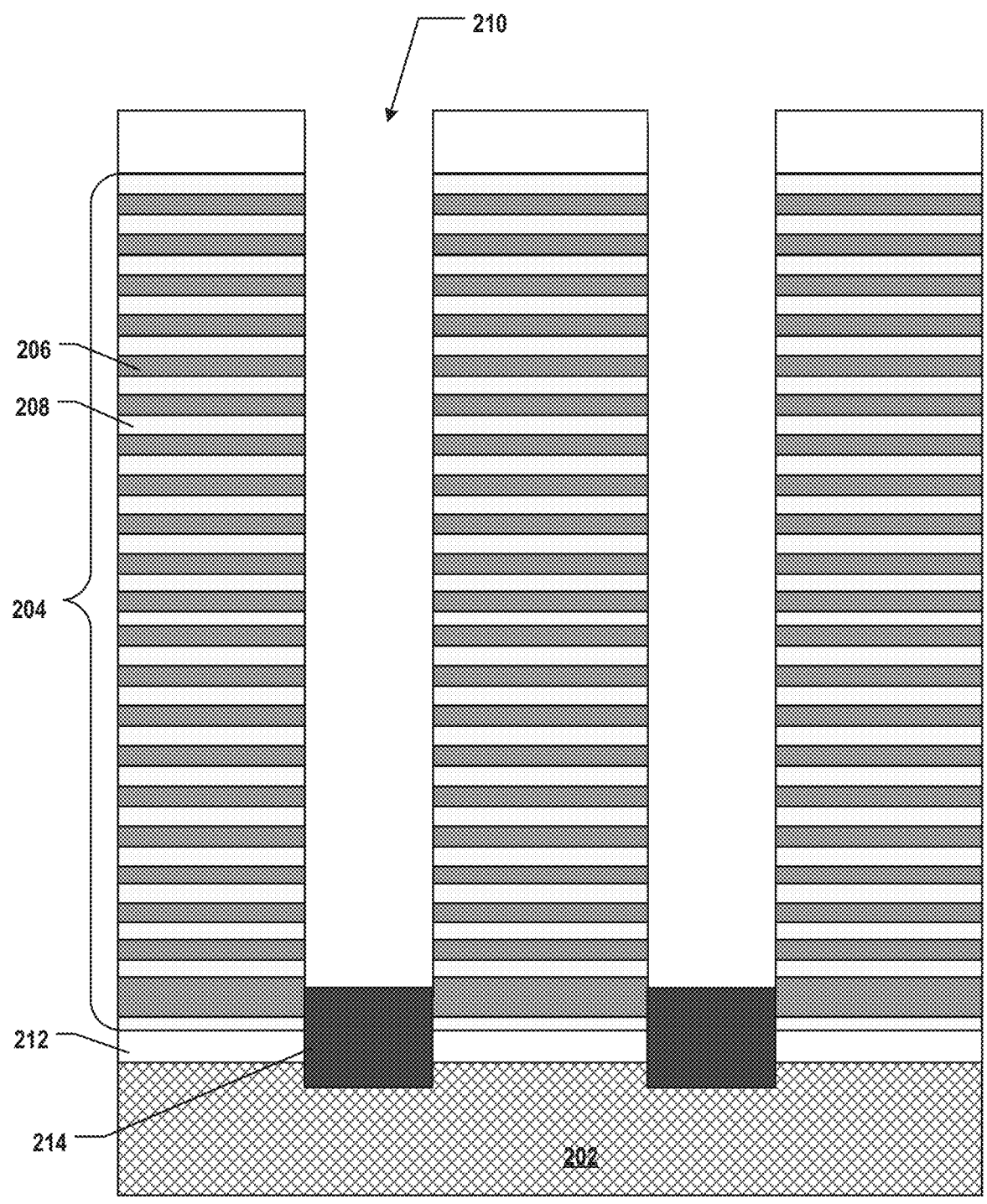
FIGS. 2A-2G illustrate a cross-section of an exemplary 3D memory device having a channel structure with a native oxide layer, according to some embodiments of the present disclosure.

Referring to FIG. 2A, a dielectric stack 204 including interleaved first dielectric layers 208 and second dielectric layers 206 are formed on a silicon substrate 202. In some embodiments, an insulation layer 212 is formed between dielectric stack 204 and silicon substrate 202 by depositing dielectric materials, such as silicon oxide, or thermal oxidation, on silicon substrate 202 prior to the formation of dielectric stack 204. First dielectric layers 208 and second dielectric layers 206 can be alternatively deposited on silicon substrate 202 to form dielectric stack 204. In some embodiments, each second dielectric layer 206 includes a layer of silicon oxide, and each first dielectric layer 208 (also known as a "sacrificial layer") includes a layer of silicon nitride. Dielectric stack 204 can be formed by one or more thin film deposition processes including, but not limited to, CVD, PVD, ALD, or any combination thereof.

Method 300 proceeds to operation 304, as illustrated in FIG. 3, in which an opening extending vertically through the dielectric stack is formed. Similarly, method 400 proceeds to operation 404, as illustrated in FIG. 4, in which an opening extending vertically through the dielectric stack is formed.

As illustrated in FIG. 2A, a channel hole 210 is formed extending vertically through dielectric stack 204. In some embodiments, a plurality of channel holes 210 are formed through dielectric stack 204, such that each channel hole 210 becomes the location for growing an individual NAND memory string in the later process. In some embodiments, fabrication processes for forming channel hole 210 include wet etching and/or dry etching, such as deep-ion reactive etching (DRIE). In some embodiments, channel hole 210 extends further through the top portion of silicon substrate 202. The etching process through dielectric stack 204 may not stop at the top surface of silicon substrate 202 and may continue to etch part of silicon substrate 202. In some embodiments, a separate etching process is used to etch part of silicon substrate 202 after etching through dielectric stack 204.

Method 300 proceeds to operation 306, as illustrated in FIG. 3, in which a semiconductor plug is formed in a lower portion of the opening. Similarly, method 400 proceeds to operation 406, as illustrated in FIG. 4, in which a semiconductor plug is formed in a lower portion of the opening. The semiconductor plug can be epitaxially grown from the substrate in the lower portion of the first opening. In some embodiments, the semiconductor plug is an epitaxially-grown silicon plug.

As illustrated in FIG. 2A, a silicon plug 214 can be formed by filling the lower portion of channel hole 210 with single crystalline silicon epitaxially grown from silicon substrate 202 in any suitable directions (e.g., from bottom surface and/or side surface). The fabrication processes for epitaxially growing silicon plug 214 can include, but not limited to, vapor-phase epitaxy (VPE), liquid-phase epitaxy (LPE), molecular-beam epitaxy (MPE), or any combinations thereof.

Method 300 proceeds to operation 308, as illustrated in FIG. 3, in which a native oxide layer is formed along a sidewall of the opening. The native oxide layer includes native oxide of at least some of the first dielectric layers. In some embodiments, to form the native oxide layer, parts of the first dielectric layers abutting the sidewall of the opening are oxidized to become the native oxide. The native oxide layer can be formed by thermal oxidation or wet chemical oxidation. In some embodiments, the thickness of the native oxide layer is between about 0.5 nm and about 5 nm, such as about 1 nm. The native oxide layer can include parts of the second dielectric layers abutting the sidewall of the opening.

Similarly, method 400 proceeds to operation 408, as illustrated in FIG. 4, in which a native oxide layer is formed along a sidewall of the opening. The native oxide layer includes native oxide of at least some of the first dielectric layers. In some embodiments, to form the native oxide layer, parts of the first dielectric layers abutting the sidewall of the opening are oxidized to become the native oxide. The native oxide layer can be formed by thermal oxidation or wet chemical oxidation. In some embodiments, the thickness of the native oxide layer is between about 4 nm and about 8 nm, such as about 6 nm. The native oxide layer can include parts of the second dielectric layers abutting the sidewall of the opening.

Figure 2B:
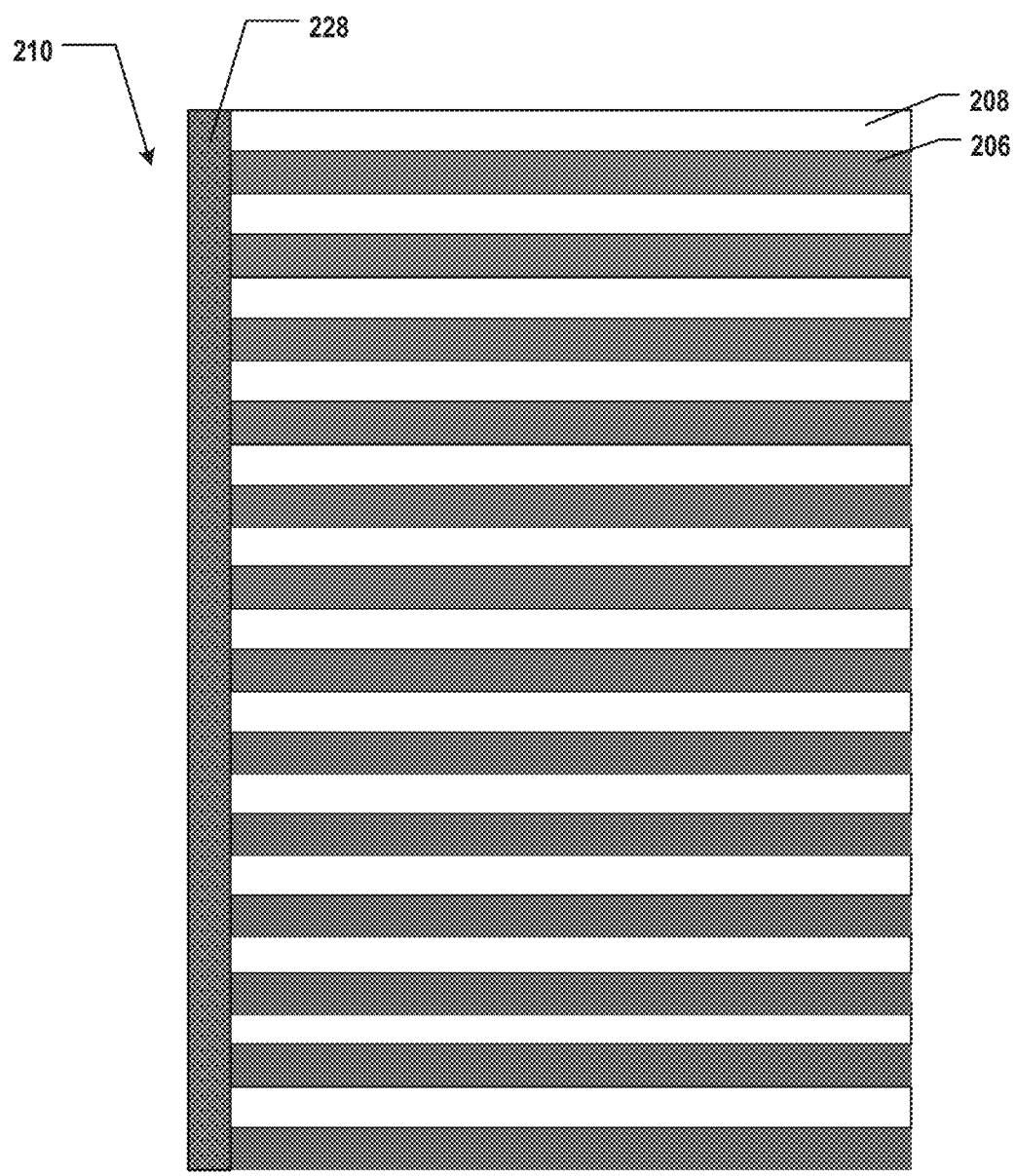
Figure 2B:
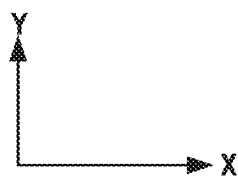

As illustrated in FIG. 2B, a native oxide layer 228 is formed along the sidewall of channel hole 210. In some embodiments, native oxide layer 228 fully covers the sidewall of channel hole 210. The thickness of native oxide layer 228 can be between about 0.5 nm and about 5 nm, such as between 0.5 nm and 5 nm (e.g., 0.5 nm, 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values). In some embodiments, the thickness of native oxide layer 228 is between about 0.5 nm and about 3 nm, such as between 0.5 nm and 3 nm. In some embodiments, the thickness of native oxide layer 228 is about 1 nm, such as 1 nm. In a different example, the thickness of native oxide layer 228 can be between about 4 nm and about 8 nm, such as between 4 nm and 8 nm (e.g., 4 nm, 4.5 nm, 5 nm, 5.5 nm, 6 nm, 6.5 nm, 7 nm, 7.5 nm, 8 nm, any range bounded by the lower end by any of these values, or in any range defined by any two of these values). In some embodiments, the thickness of native oxide layer 228 is between about 5 nm and about 8 nm, such as between 5 nm and 8 nm. In some embodiments, the thickness of native oxide layer 228 is about 6 nm, such as 6 nm. The different thickness ranges of native oxide layer 228 can be used in different examples, for example, in FIG. 2D and FIG. 2E as described below in detail.

Native oxide layer 228 can be formed by oxidizing the sidewall of channel hole 210 (including left portions of first dielectric layers 208) to form native oxide with the thickness in the ranges described above. In some embodiments, the native oxide of parts of first dielectric layers 208 abutting the sidewall of channel hole 210 is oxidized by a thermal oxidation process. Either dry oxidation using molecular oxygen as the oxidant or wet oxidation using water vapor as the oxidant can be used to form the native oxide at a temperature, for example, not greater than about 850° C. In some embodiments, the thermal oxidation is performed between about 500° C. and about 850° C., such as between 500° C. and 850° C. (e.g., 500° C., 550° C., 600° C., 650° C., 700° C., 750° C., 800° C., 850° C., any range bounded by the lower end by any of these values, or in any range defined by any two of these values). In some embodiments, the thermal oxidation is performed at about 700° C., such as 700° C. As thermal oxide incorporates silicon consumed from dielectric stack 204 and oxygen supplied from the ambient, native oxide layer 228 can grow both to the right into dielectric stack 204 and to the left out of dielectric stack 204, resulting in part of the native oxide layer thickness lying over the original sidewall surface of channel hole 210, and part inside dielectric stack 204. The thickness of the resulting native oxide layer can be controlled by the thermal oxidation temperature and/or time.

In some embodiments, the native oxide of parts of first dielectric layers 208 abutting the sidewall of channel hole 210 is oxidized by a wet chemical oxidation process. Wet chemicals including ozone can be used to oxidize parts of first dielectric layers 208 abutting the sidewall of channel hole 210 to form native oxide. In some embodiments, the wet chemical is a mixture of hydrofluoric acid and ozone (e.g., FOM). For example, the hydrofluoric acid has a concentration of 49% in the ultra-pure water. The thickness of the resulting native oxide layer can be controlled by the wet chemical compositions, temperature, and/or time. It is understood that native oxide layer 228 can be formed using any other suitable processes, such as in situ steam generation (ISSG) process, which use oxygen gas and hydrogen gas to create water in the form of steam.

In some embodiments, first dielectric layers 208 include silicon nitride, and second dielectric layers 206 include silicon oxide. Oxidation of the silicon nitride in first dielectric layers 208 can generate silicon oxynitride, which can remain in native oxide layer 228 with silicon oxide, or partially or fully removed from native oxide layer 228 using any suitable processes. Nevertheless, native oxide layer 228 can include silicon oxide from second dielectric layers 206 and/or the native oxide of first dielectric layers 208.

Method 300 proceeds to operation 310, as illustrated in FIG. 3, in which a blocking layer, a storage layer, a tunneling layer, and a semiconductor channel are subsequently formed in this order over the native oxide layer and along the sidewall of the opening. In some embodiments, to form the blocking layer, a silicon oxide layer is deposited over the native oxide layer. The silicon oxide layer can be deposited by ALD.

Figure 2C:
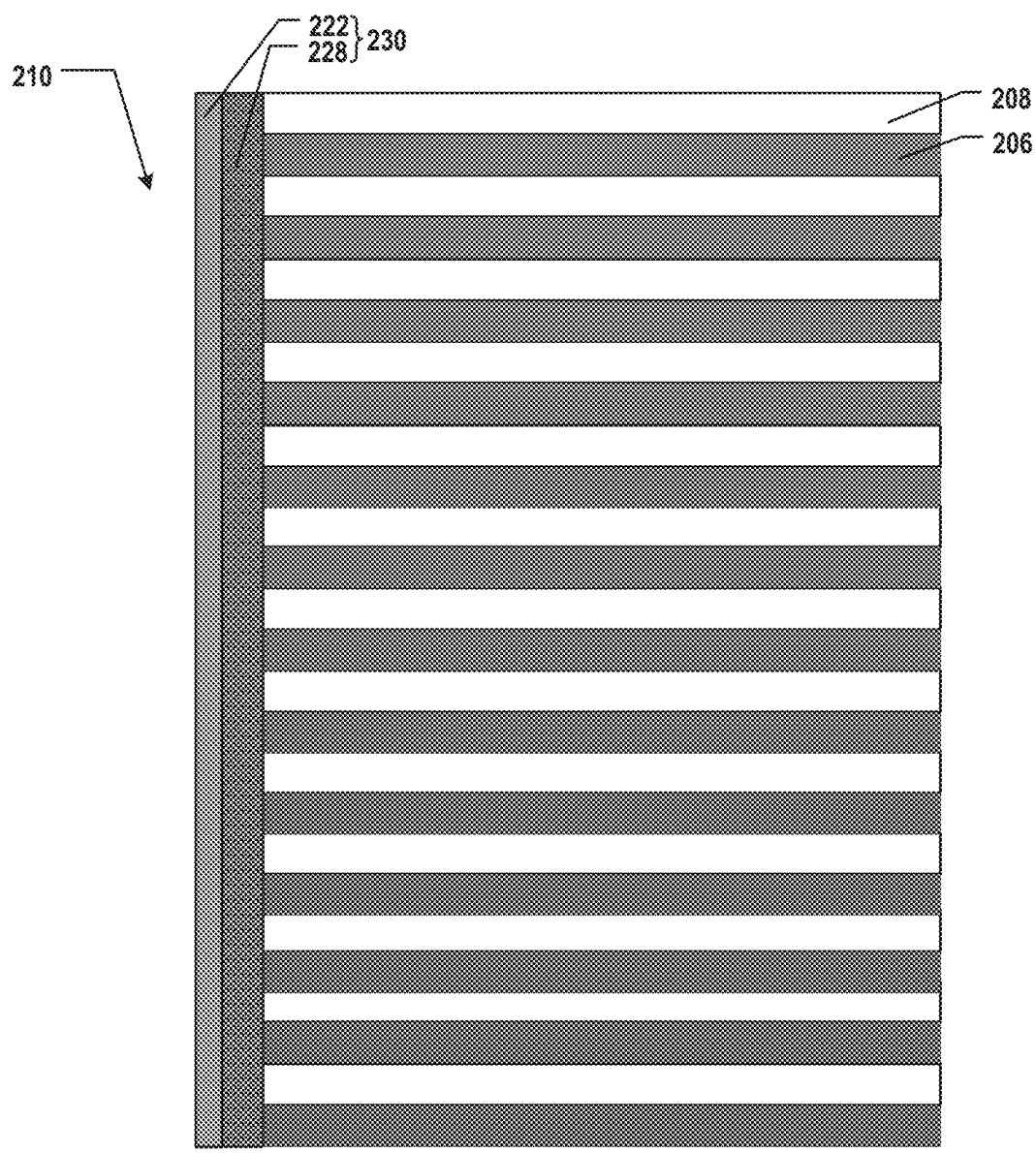

As illustrated in FIG. 2C, a deposited oxide layer 222 is formed over native oxide layer 228. In some embodiments, deposited oxide layer 222 fully covers native oxide layer 228 along the entire depth of the sidewall of dielectric stack 204 (shown in FIG. 2A). The composite layer including deposited oxide layer 222 and native oxide layer 228 can become a blocking layer 230 of a 3D memory device. Because blocking layer 230 in this example is a composite layer having deposited oxide layer 222, the thickness of native oxide layer 228 can be in the relatively low range, such as between about 0.5 nm and about 5 nm, as described above in detail. In some embodiments, the combined thickness of native oxide layer 228 and thickness of deposited oxide layer 222 (i.e., the thickness of blocking layer 230) is between about 4 nm and about 8 nm, such as between 4 nm and 8 nm. The thickness of deposited oxide layer can be equal to or less than about 7.5 nm. Deposited oxide layer 222 can be formed by depositing a conformal layer of oxide materials, such as silicon oxide, using one or more conformal thin firm deposition processes, such as ALD and CVD, with a thickness in the range described above. In some embodiments, a silicon oxide layer is deposited by ALD to form deposited oxide layer 222 over native oxide layer 228.

Figure 2D:
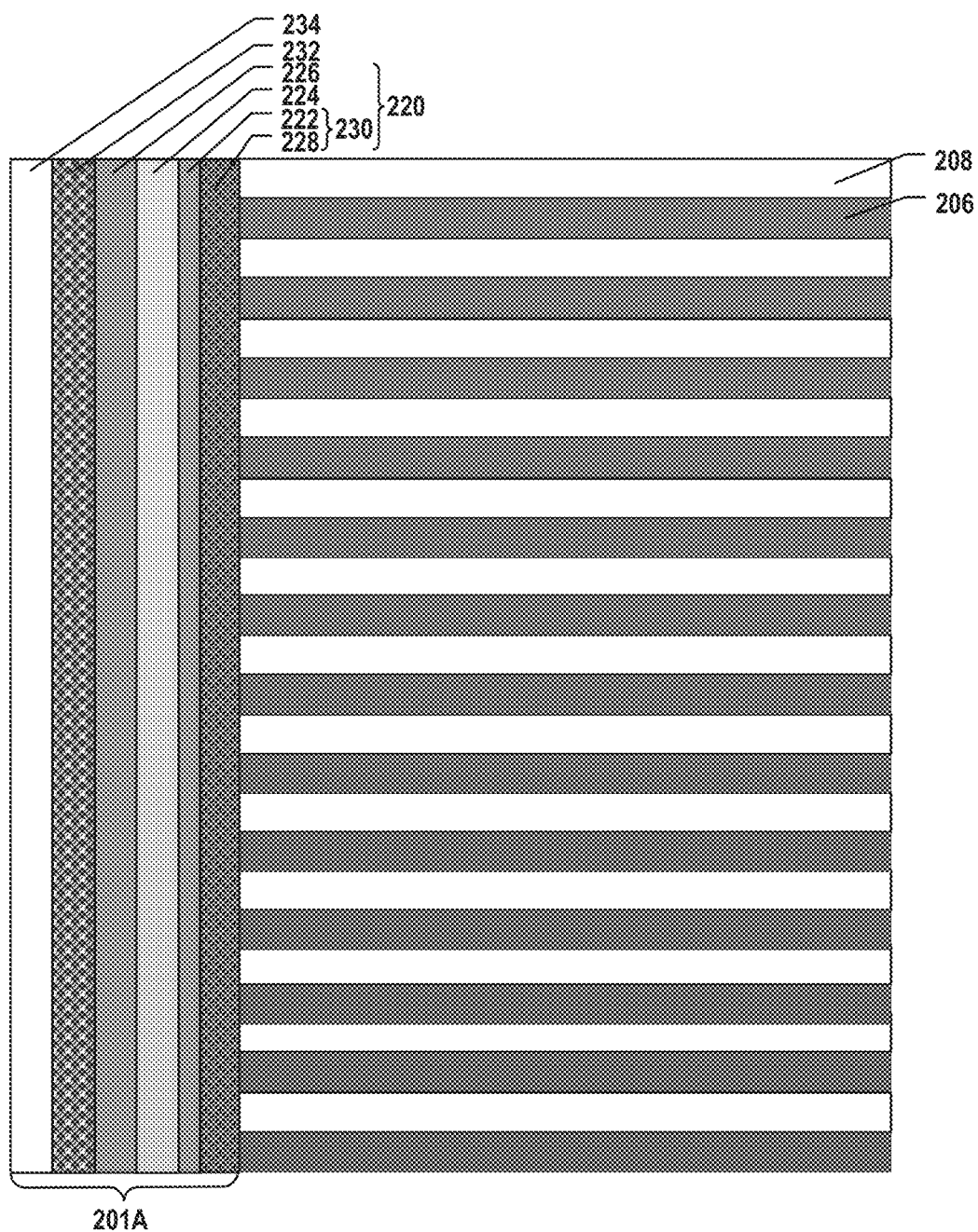

As illustrated in FIG. 2D, a memory film 220 (including blocking layer 230, a storage layer 224, and a tunneling layer 226) is formed along the sidewall of channel hole 210 (shown in FIG. 2C). Storage layer 224 (e.g., a silicon nitride layer or a silicon oxynitride layer) and tunneling layer 226 (e.g., a silicon oxide layer) can be subsequently deposited in this order using one or more thin film deposition processes, such as ALD, CVD, PVD, any other suitable processes, or any combination thereof, over deposited oxide layer 222 of blocking layer 230. In some embodiments, memory film 220 can fully cover the sidewall of channel hole 210. As illustrated in FIG. 2D, a semiconductor channel 232 is formed over tunneling layer 226 of memory film 220 using one or more thin film deposition processes, such as CVD, PVD, ALD, electroplating, electroless plating, or any combination thereof. In some embodiments, semiconductor channel 232 includes polysilicon. As illustrated in FIG. 2D, a capping layer 234, such as a silicon oxide layer, is formed in channel hole 210 to fully or partially fill the remaining space of channel hole 210 using one or more thin film deposition processes, such as CVD, PVD, ALD, electroplating, electroless plating, or any combination thereof. A channel structure 201A including blocking layer 230 (having native oxide layer 228 and deposited oxide layer 222), storage layer 224, tunneling layer 226, semiconductor channel 232, and capping layer 234 is thus formed as shown in FIG. 2D. Native oxide layer 228 can be the outermost layer of channel structure 201A in contact with interleaved dielectric layers 206 and 208 of dielectric stack 204.

Referring to FIG. 4, in a different example, method 400 proceeds to operation 410, as illustrated in FIG. 4, in which a storage layer, a tunneling layer, and a semiconductor channel are subsequently formed in this order over the native oxide layer and along the sidewall of the opening. In some embodiments, to form the storage layer, a silicon nitride layer or a silicon oxynitride layer is deposited over the native oxide layer.

Figure 2E:
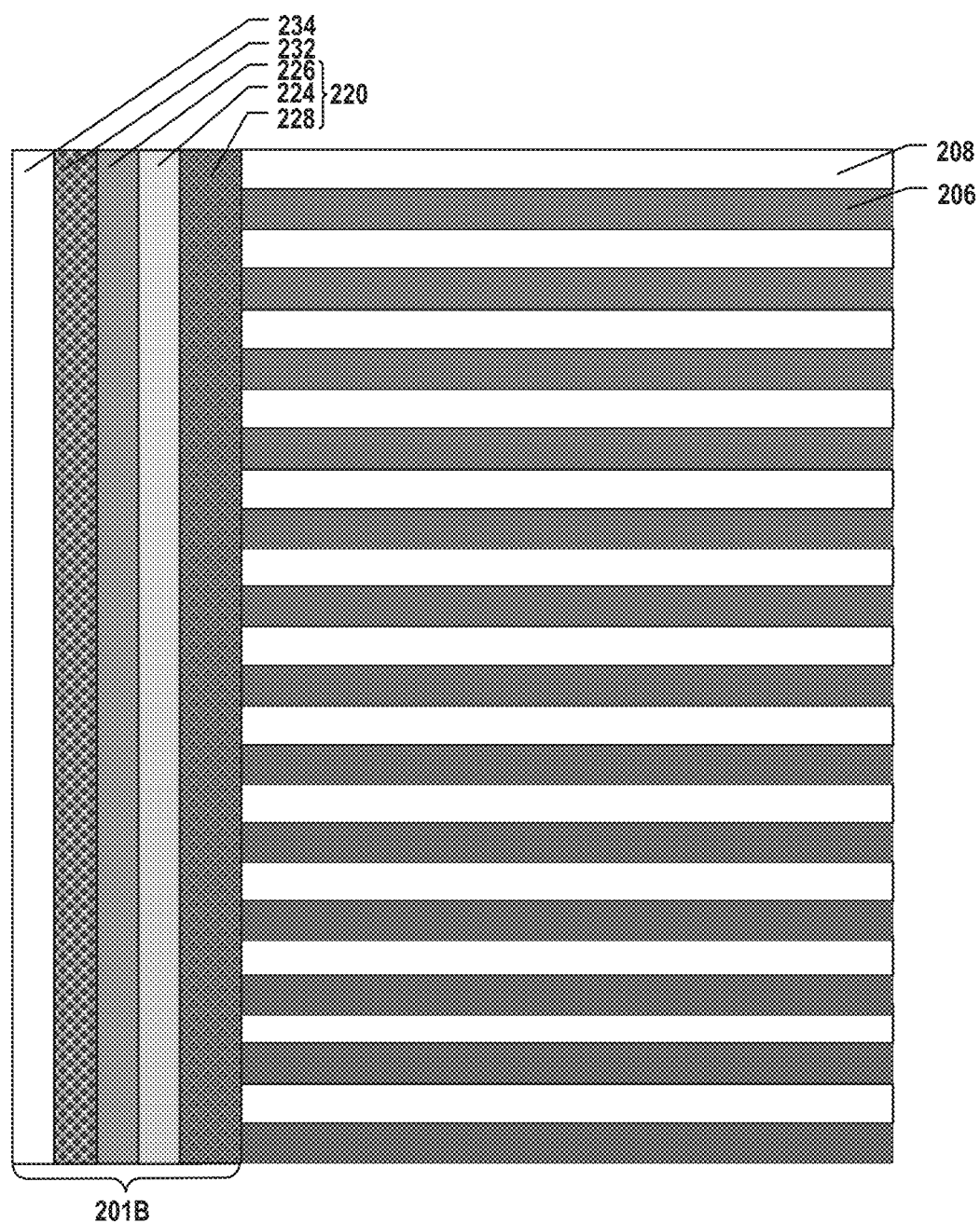

As illustrated in FIG. 2E, native oxide layer 228 alone becomes the blocking layer. Because blocking layer 230 in this example includes native oxide layer 228 alone without a deposited oxide layer, the thickness of native oxide layer 228 can be in the relatively high range, such as between about 4 nm and about 8 nm, as described above in detail. Memory film 220 (including blocking layer 228, storage layer 224, and tunneling layer 226) is formed along the sidewall of channel hole 210 (shown in FIG. 2C). Storage layer 224 (e.g., a silicon nitride layer or a silicon oxynitride layer) and tunneling layer 226 (e.g., a silicon oxide layer) can be subsequently deposited in this order using one or more thin film deposition processes, such as ALD, CVD, PVD, any other suitable processes, or any combination thereof, over native oxide layer 228. In some embodiments, a silicon nitride layer or a silicon oxynitride layer is deposited over native oxide layer 228 as storage layer 224. In some embodiments, memory film 220 can fully cover the sidewall of channel hole 210.

As illustrated in FIG. 2E, semiconductor channel 232 is formed over tunneling layer 226 of memory film 220 using one or more thin film deposition processes, such as CVD, PVD, ALD, electroplating, electroless plating, or any combination thereof. In some embodiments, semiconductor channel 232 includes polysilicon. As illustrated in FIG. 2E, capping layer 234, such as a silicon oxide layer, is formed in channel hole 210 to fully or partially fill the remaining space of channel hole 210 using one or more thin film deposition processes, such as CVD, PVD, ALD, electroplating, electroless plating, or any combination thereof. A channel structure 201B including blocking layer 228 (i.e., native oxide layer 228), storage layer 224, tunneling layer 226, semiconductor channel 232, and capping layer 234 is thus formed as shown in FIG. 2E. Native oxide layer 228 can be the outermost layer of channel structure 201B in contact with interleaved dielectric layers 206 and 208 of dielectric stack 204.

Method 300 proceeds to operation 312, as illustrated in FIG. 3, a memory stack is formed by gate replacement. Similarly, method 400 proceeds to operation 412, as illustrated in FIG. 4, a memory stack is formed by gate replacement. The memory stack includes interleaved conductor layers and the second dielectric layers and is formed by replacing, with the conductor layers, the first dielectric layers in the dielectric stack. In some embodiments, to form the memory stack, a slit opening (e.g., a gate line slit) can be formed through the dielectric stack, the first dielectric layers in the dielectric stack can be etched by applying the etchants through the slit opening to form a plurality of lateral recesses, and the conductor layers can be deposited in the lateral recesses. In some embodiments, in forming the memory stack, the first dielectric layers of the dielectric stack are etched until being stopped by the native oxide layer.

Figure 2F:
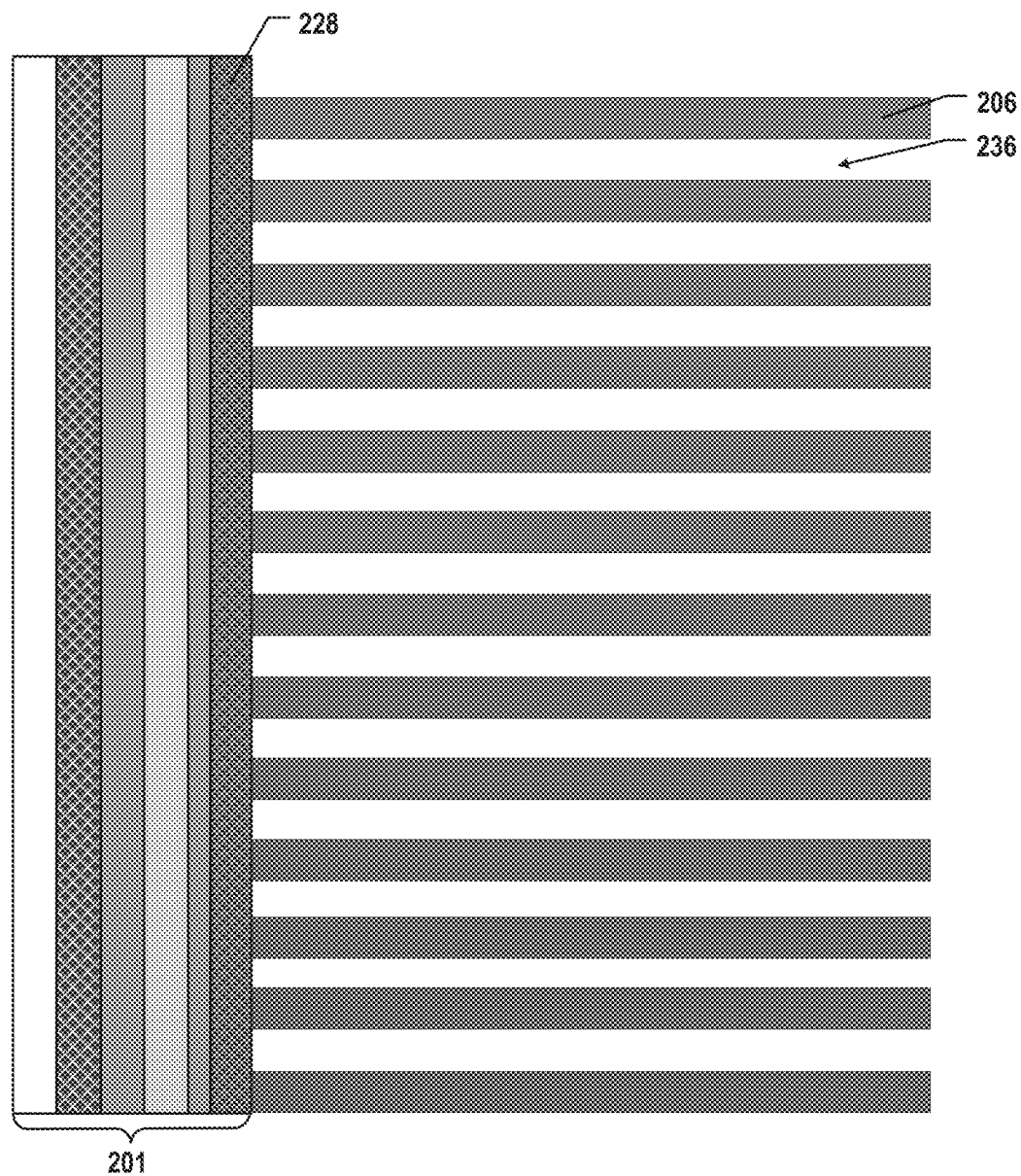

As illustrated in FIG. 2F, first dielectric layers 208 (e.g., silicon oxide layers, shown in FIG. 2D or FIG. 2E) are removed by, for example, wet etching, to form a plurality of lateral recesses 236 between second dielectric layers 206. In some embodiments, etchants (e.g., phosphoric acid) are applied through slit openings (not shown) to selectively etch silicon nitride of first dielectric layers 208 against silicon oxide of second dielectric layers 206. The etching of first dielectric layers 208 can be stopped by native oxide layer 228 in the lateral direction to prevent further damage to channel structure 201. That is, native oxide layer 228 can act as the etch stop layer during the removal of first dielectric layers 208. It is understood that the etchants for removing first dielectric layers 208 mat still etch native oxide layer 228 to a certain degree. In one example, the thickness of native oxide layer 228 may be reduced after the etching of first dielectric layers 208, but still exist in the resulting 3D memory device, either with or without deposited oxide layer 222. In another example, native oxide layer 228 may be fully removed after the etching of first dielectric layers 208, leaving deposited oxide layer 222 alone as the blocking layer in the resulting 3D memory device. In any event, native oxide layer 228 can be used to control the thickness of the blocking layer in the resulting 3D memory device.

Figure 2G:
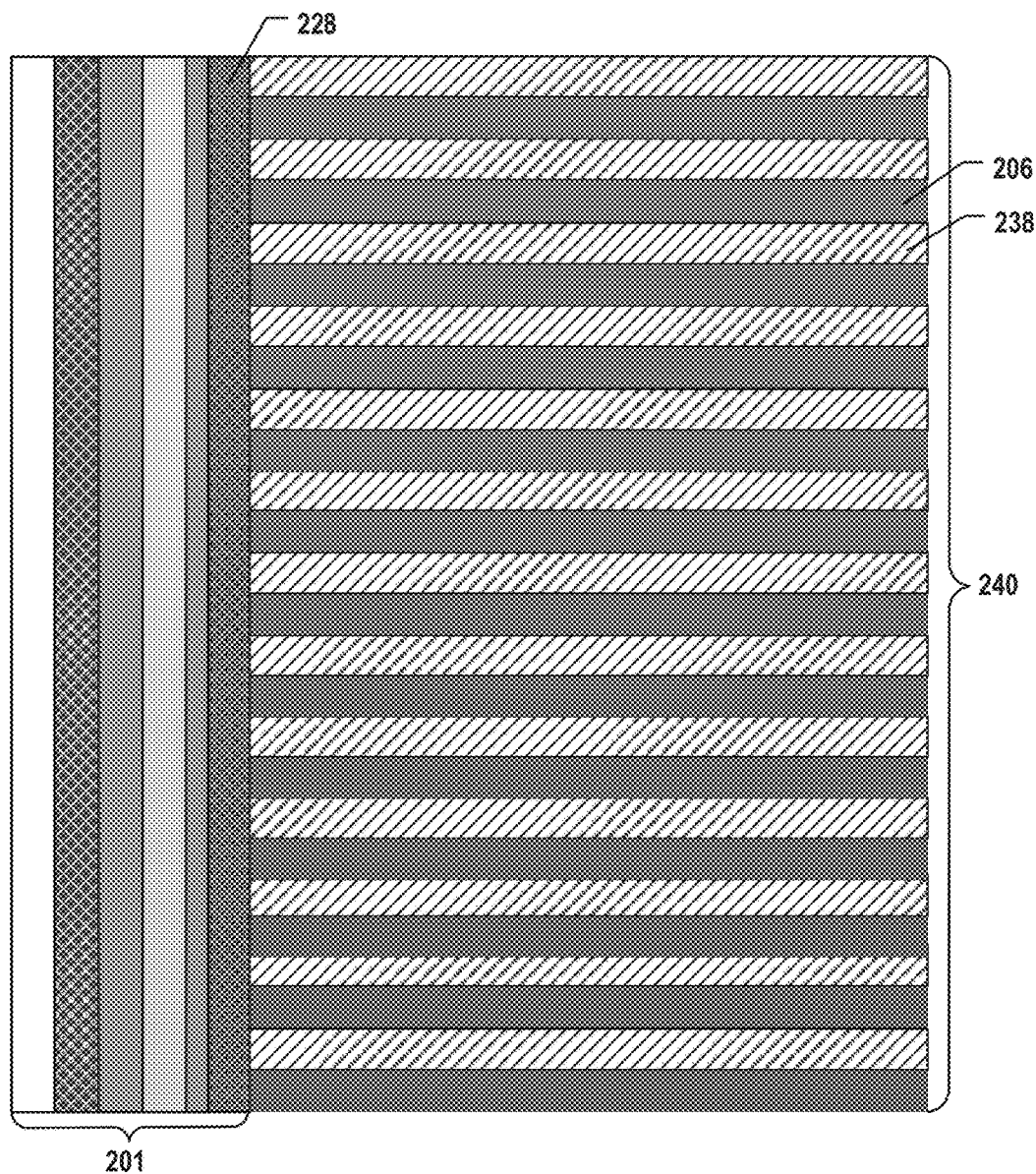

As illustrated in FIG. 2G, conductor layers 238 (e.g., tungsten layers) are deposited to fill lateral recesses 236 (shown in FIG. 2F) using one or more thin film deposition processes, such as CVD, PVD, ALD, electroplating, electroless plating, or any combination thereof. A memory stack 240 can thus be formed with interleaved conductor layers 238 and dielectric layers 206. Conductor layers 238 can in contact with the outermost layer channel structure 201 (e.g., native oxide layer 228 of the blocking layer). It is understood that although channel structure 201 in FIGS. 2F-2G includes deposited oxide layer 222 and native oxide layer 228, it is understood that in some embodiments, channel structure 201 includes deposited oxide layer 222 alone (as native oxide layer 228 has been fully removed during the gate replacement processes) or native oxide layer 228 alone (e.g., as in the example of channel structure 201B in FIG. 2E).

According to one aspect of the present disclosure, a method for forming a 3D memory device is disclosed. A dielectric stack is formed on a substrate. The dielectric stack includes interleaved first dielectric layers and second dielectric layers on a substrate. An opening extending vertically through the dielectric stack is formed. A native oxide layer is formed along a sidewall of the opening. The native oxide layer includes native oxide of at least some of the first dielectric layers. A deposited oxide layer, a storage layer, a tunneling layer, and a semiconductor channel are subsequently formed in this order over the native oxide layer and along the sidewall of the opening. A memory stack includes interleaved conductor layers and the second dielectric layers is formed by replacing, with the conductor layers, the first dielectric layers in the dielectric stack.

In some embodiments, to form the native oxide layer, parts of the first dielectric layers abutting the sidewall of the opening are oxidized. In some embodiments, the native oxide layer is formed by thermal oxidation. A temperature of the thermal oxidation is not greater than about 850° C., according to some embodiments. In some embodiments, the native oxide layer is formed by wet chemical oxidation.

In some embodiments, the native oxide layer includes parts of the second dielectric layers abutting the sidewall of the opening.

In some embodiments, a thickness of the native oxide layer is between about 0.5 nm and about 5 nm. The thickness of the native oxide layer can be about 1 nm.

In some embodiments, each of the first dielectric layers includes silicon nitride, and each of the second dielectric layers includes silicon oxide.

In some embodiments, the deposited oxide layer and the native oxide layer form a blocking layer. In some embodiments, the deposited oxide layer is formed by ALD.

In some embodiments, to form the memory stack, the first dielectric layers are etched until being stopped by the native oxide layer.

In some embodiments, prior to forming the native oxide layer, a semiconductor plug is formed in a lower portion of the opening.

According to another aspect of the present disclosure, a method for forming a 3D memory device is disclosed. A dielectric stack including interleaved first dielectric layers and second dielectric layers is formed on a substrate. An opening extending vertically through the dielectric stack is formed. A native oxide layer is formed along a sidewall of the opening. The native oxide layer includes native oxide of at least some of the first dielectric layers. A storage layer, a tunneling layer, and a semiconductor channel are subsequently formed in this order over the native oxide layer and along the sidewall of the opening. A memory stack including interleaved conductor layers and the second dielectric layers is formed by replacing, with the conductor layers, the first dielectric layers in the dielectric stack.

In some embodiments, to form the native oxide layer, parts of the first dielectric layers abutting the sidewall of the opening are oxidized to become the native oxide. In some embodiments, the native oxide layer is formed by thermal oxidation. A temperature of the thermal oxidation is not greater than about 850° C., according to some embodiments. In some embodiments, the native oxide layer is formed by wet chemical oxidation.

In some embodiments, the native oxide layer includes parts of the second dielectric layers abutting the sidewall of the opening. In some embodiments, a thickness of the native oxide layer is between about 4 nm and about 8 nm.

In some embodiments, each of the first dielectric layers includes silicon nitride, and each of the second dielectric layers includes silicon oxide.

In some embodiments, to form the storage layer, a silicon nitride layer or a silicon oxynitride layer is deposited over the native oxide layer.

In some embodiments, to form the memory stack, the first dielectric layers are etched until being stopped by the native oxide layer.

In some embodiments, prior to forming the native oxide layer, a semiconductor plug is formed in a lower portion of the opening.

According to still another aspect of the present disclosure, a 3D memory device includes a substrate, a memory stack disposed on the substrate and including interleaved conductor layers and dielectric layers, and a channel structure extending vertically through the memory stack. The channel structure includes a native oxide layer abutting the interleaved conductor layers and dielectric oxide layers.

In some embodiments, a thickness of the native oxide layer is between about 0.5 nm and about 5 nm. In some embodiments, the thickness of the native oxide layer is about 1 nm. The channel structure further includes a deposited oxide layer in contact with the native oxide layer, according to some embodiments.

In some embodiments, a thickness of the native oxide layer is between about 4 nm and about 8 nm.

In some embodiments, the channel structure further includes a silicon nitride layer or a silicon oxynitride layer in contact with the native oxide layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments but should be defined only in accordance with the following claims and their equivalents.

What is claimed is:

1. A method for forming a three-dimensional (3D) memory device, comprising:
   forming a dielectric stack comprising interleaved first dielectric layers and second dielectric layers on a substrate;
   forming an opening extending vertically through the dielectric stack;
   performing wet chemical oxidation comprising ozone to form a native oxide layer along a sidewall of the opening, the native oxide layer comprising native oxide of at least some of the first dielectric layers;
   subsequently forming a deposited oxide layer, a storage layer, a tunneling layer, and a semiconductor channel over the native oxide layer and along the sidewall of the opening in this order; and
   forming a memory stack comprising interleaved conductor layers and the second dielectric layers by replacing, with the conductor layers, the first dielectric layers in the dielectric stack.

2. The method of claim 1, wherein the parts of the first dielectric layers are abutting the sidewall of the opening.

3. The method of claim 1, wherein the native oxide layer comprises parts of the second dielectric layers abutting the sidewall of the opening.

4. The method of claim 1, wherein a thickness of the native oxide layer is between about 0.5 nm and about 5 nm.

5. The method of claim 4, wherein the thickness of the native oxide layer is about 1 nm.

6. The method of claim 1, wherein each of the first dielectric layers comprises silicon nitride, and each of the second dielectric layers comprises silicon oxide.

7. The method of claim 1, wherein the deposited oxide layer and the native oxide layer form a blocking layer.

8. The method of claim 1, wherein the deposited oxide layer is formed by atomic layer deposition (ALD).

9. The method of claim 1, wherein forming the memory stack comprises etching the first dielectric layers until being stopped by the native oxide layer.

10. A method for forming a three-dimensional (3D) memory device, comprising:
- forming a dielectric stack comprising interleaved first dielectric layers and second dielectric layers on a substrate;
- forming an opening extending vertically through the dielectric stack;
- performing wet chemical oxidation comprising ozone to form a native oxide layer along a sidewall of the opening, the native oxide layer comprising native oxide of at least some of the first dielectric layers;
- subsequently forming a storage layer, a tunneling layer, and a semiconductor channel over the native oxide layer and along the sidewall of the opening in this order; and
- forming a memory stack comprising interleaved conductor layers and the second dielectric layers by replacing, with the conductor layers, the first dielectric layers in the dielectric stack.

11. The method of claim 10, wherein forming the native oxide layer comprises oxidizing parts of the first dielectric layers abutting the sidewall of the opening to become the native oxide.

12. The method of claim 10, further comprising forming a deposited oxide layer over the native oxide layer and along the sidewall of the opening prior to the formation of the storage layer.

13. The method of claim 10, wherein the native oxide layer comprises parts of the second dielectric layers abutting the sidewall of the opening.

14. The method of claim 10, wherein forming the storage layer comprises depositing a silicon nitride layer or a silicon oxynitride layer over the native oxide layer.

15. The method of claim 12, wherein the deposited oxide layer and the native oxide layer form a blocking layer.

16. The method of claim 1, wherein forming the native oxide layer comprising forming at least one of silicon oxide, silicon oxynitride, or a mixture of silicon oxide and silicon oxynitride.

17. The method of claim 4, wherein a combination of the thickness of the native oxide layer and a thickness of the deposited oxide layer is between about 4 nm and about 8 nm.

18. The method of claim 10, wherein forming the native oxide layer comprising forming at least one of silicon oxide, silicon oxynitride, or a mixture of silicon oxide and silicon oxynitride.

19. The method of claim 1, further comprising removing at least part of the native oxide layer in replacing the first dielectric layers in the dielectric stack with the conductor layers.

20. The method of claim 10, wherein a thickness of the native oxide layer is between about 4 nm and about 8 nm.

* * * * *